(12) United States Patent  (10) Patent No.: US 7,557,449 B2
Liu  (45) Date of Patent: Jul. 7, 2009

(54) FLEXIBLE VIA DESIGN TO IMPROVE RELIABILITY

(75) Inventor: Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 287 days.

(21) Appl. No.: 11/518,333

(22) Filed: Sep. 7, 2006

(65) Prior Publication Data

US 2008/0061441 A1    Mar. 13, 2008

(51) Int. Cl.
H01L 23/522 (2006.01)
H01L 23/48 (2006.01)
H01L 27/02 (2006.01)

(52) U.S. Cl. .............. 257/774; 257/E23.145; 257/758; 257/700; 257/701; 257/775; 257/776; 257/784; 257/207; 257/211; 257/208; 257/797

(58) Field of Classification Search ............ 257/774, 257/E23.145, 758, 701, 700, 775, 776, 784, 257/207, 211, 208, 797
See application file for complete search history.

(56) References Cited

U.S. PATENT DOCUMENTS

| 4,959,708 | A | * | 9/1990 | Henderson et al. | ......... 257/659 |
|---|---|---|---|---|---|
| 5,014,098 | A | * | 5/1991 | Schlais et al. | ............... 257/316 |
| 5,811,316 | A | * | 9/1998 | Sugiura et al. | .............. 438/688 |
| 6,551,919 | B2 | * | 4/2003 | Venkatesan et al. | ........ 438/622 |
| 6,670,714 | B1 | * | 12/2003 | Miyamoto et al. | ......... 257/758 |
| 6,759,324 | B1 | * | 7/2004 | Rhodes et al. | .............. 438/628 |
| 6,841,883 | B1 | * | 1/2005 | Farnworth et al. | .......... 257/774 |
| 7,188,322 | B2 | * | 3/2007 | Cohn et al. | ................... 716/2 |
| 2002/0057099 | A1 | * | 5/2002 | Esashi et al. | ................ 324/761 |
| 2002/0180015 | A1 | * | 12/2002 | Yamaguchi et al. | ........ 257/678 |
| 2004/0140495 | A1 | * | 7/2004 | Uchiyama et al. | .......... 257/296 |
| 2004/0245645 | A1 | * | 12/2004 | Miyamoto et al. | .......... 257/758 |

* cited by examiner

Primary Examiner—Alexander O Williams
(74) Attorney, Agent, or Firm—Slater & Matsil, L.L.P.

(57) ABSTRACT

An integrated circuit includes a metallization layer, a first metal line in the metallization layer, and a first via electrically connected to the first metal line. The first via has a first via width and a first pitch from a nearest via on a neighboring metal line, wherein the first pitch is a minimum pitch of all vias on the metallization layer. The integrated circuit further includes a second metal line in the metallization layer, and a second via electrically connected to the second metal line. The second via has a second pitch greater than about 1.1 times the first pitch. The second via has a second via width greater than the first via width but no more than about 1.4 times the first via width.

20 Claims, 8 Drawing Sheets

FLEXIBLE VIA DESIGN TO IMPROVE RELIABILITY

TECHNICAL FIELD

This invention is related generally to integrated circuits, and more particularly to the formation of interconnect structures of integrated circuits.

BACKGROUND

Conductive lines or interconnect structures are used to connect devices in integrated circuits and to connect to external pads. Adjacent interconnect lines form parasitic capacitors. The plate area of each plate of the capacitor is the product of the length of the line and its thickness over that length. The capacitances of such capacitors are directly proportional to the area of the capacitor plates and the dielectric constant of the dielectric material disposed between the plates, and are inversely proportional to the distance between the capacitor plates (line-to-line spacing). Thus, as IC's are scaled down in size, the line-to-line spacing decreases. In addition, the number of lines that are needed to interconnect the increased number of devices also increases, resulting in an increase in the line-to-line capacitance. In some high-speed circuits, this interconnect capacitance can be the limiting factor in the speed of the integrated circuit. Thus it is desirable to reduce the interconnect capacitance. Accordingly, low dielectric constant (low k) materials have been increasingly used.

The use of low-k dielectric materials, however, has introduced new problems. Low-k dielectric materials typically have low thermal conductivity, and thus are not good at dissipating heat. On the other hand, with the increase in device density, high currents are conducted by the metal lines in the low-k dielectric layers. Joule heating effect, thus, may occur. The high density of metal lines further worsens the problem. The Joule heating effect causes an increase in the temperature, and in turn significantly affects the reliability of the interconnect structure, and electro-migration and stress-migration effects are worsened. A solution is, thus, needed to solve these problems.

SUMMARY OF THE INVENTION

In accordance with one aspect of the present invention, an integrated circuit includes a metallization layer, a first metal line in the metallization layer, and a first via electrically connected to the first metal line. The first via has a first via width, and a first pitch from a nearest via on a neighboring metal line, wherein the first pitch is a minimum pitch of all vias on the metallization layer. The integrated circuit further includes a second metal line in the metallization layer, and a second via electrically connected to the second metal line. The second via has a second pitch greater than about 1.1 times the first pitch. The second via has a second via width greater than the first via width but no more than about 1.4 times the first via width.

In accordance with another aspect of the present invention, an integrated circuit includes a metallization layer, a first metal line having a first line width in the metallization layer, and a first via electrically connected to the first metal line, wherein the first via has a first via width and a first pitch from a nearest via on a neighboring metal line, and wherein the first pitch is a minimum pitch of vias on the metallization layer. The integrated circuit further includes a second metal line in the metallization layer, wherein the second metal line has a second line width and a length, and wherein the length of the second metal line divided by a square of the first via width is greater than about 1000 when the length and the first via width are in microns. A second via is electrically connected to the second metal line, wherein the second via has a second pitch from a via on a neighboring metal line, and wherein the second pitch is greater than about 3.5 times the first pitch, and wherein the second via has a second via width greater than the first via width but no more than about 1.4 times the first via width.

In accordance with yet another aspect of the present invention, an integrated circuit includes a metallization layer, a first metal line in the metallization layer, and a first via electrically connected to the first metal line, wherein the first via has a first via width, and a first pitch from a nearest via on the first metal line, and wherein the first pitch is a minimum pitch of all vias on the metallization layer. The integrated circuit further includes a second metal line in the metallization layer, and a second via on and electrically connected to the second metal line, wherein the second via has a second pitch from a nearest neighboring via on the second metal line, and wherein the second pitch is greater than about 1.1 times the first pitch. The second via has a second via width greater than the first via width but no more than about 1.4 times the first via width.

The advantageous features of the present invention include improved reliability and lowered cost for achieving the reliability improvement.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
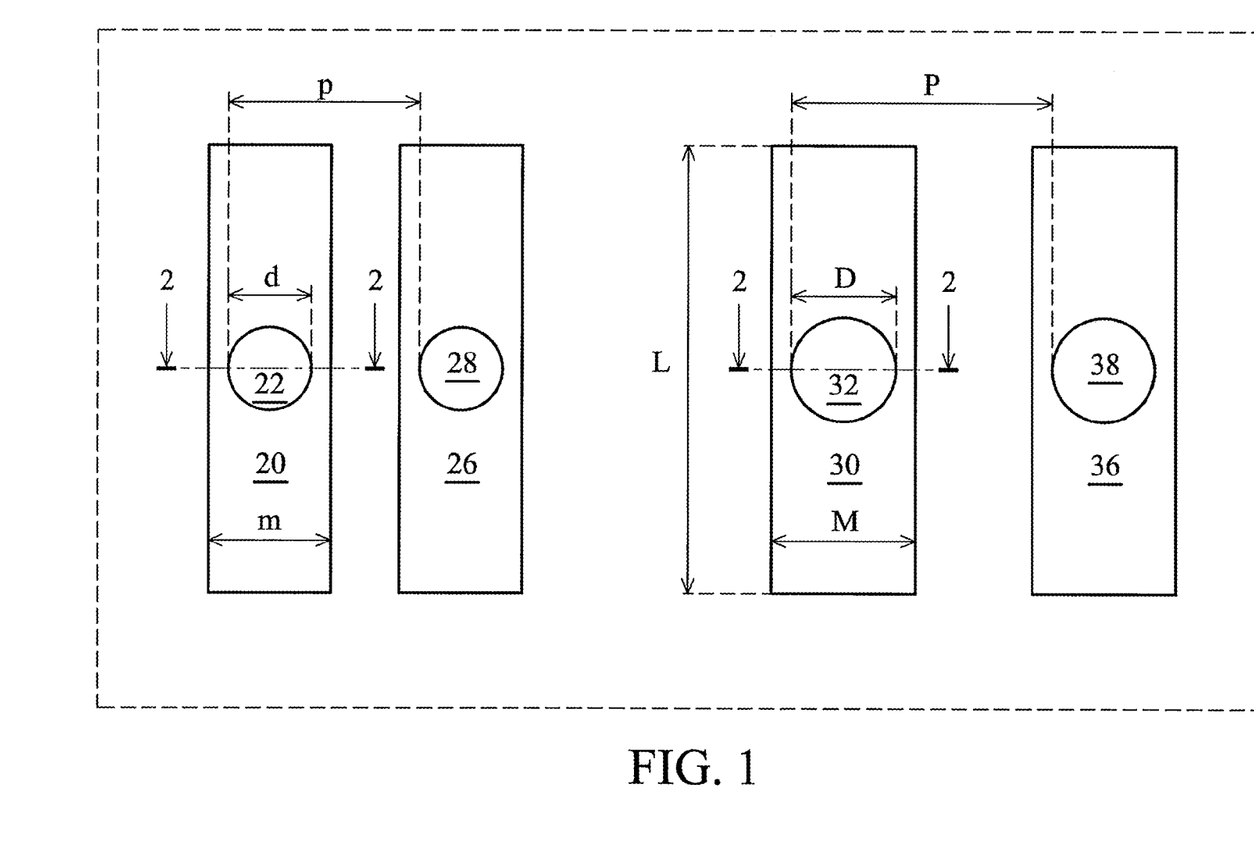
FIG. 1 illustrates a top view of a preferred embodiment having two groups of metal lines and vias, wherein metal lines in each group are parallel to each other.

FIG. 1 illustrates a top view of portions of a metallization layer $M_x$, wherein x is an integer representing the number of the metallization layer. Metallization layer $M_x$ includes a first group of metal lines 20 and 26, and a second group of metal lines 30 and 36. Vias 22 and 28 connect metal lines 20 and 26 to overlying metal lines (not shown in FIG. 1), respectively. Via 22 has a width d, which is between metallization layer $M_x$ and the overlying metallization layer, namely $M_{x+1}$. Vias 22 and 28 have a pitch p, which is the minimum pitch of all vias in the same layer. Please note that the minimum pitch p is a pitch between two vias having different voltage potentials. If two vias are connected to a same potential (for example, the two vias are connected to a same metal line), they may have a pitch less than the minimum pitch p. Metal line 20 has a width m. Similarly, vias 32 and 38 connect metal lines 30 and 36 to the overlying metal lines (not shown in FIG. 1), respectively. Via 32 has a width D, which may be equal to or greater than width d. Vias 32 and 38 have a pitch P. Metal line 30 has a width M.

Figure 2:
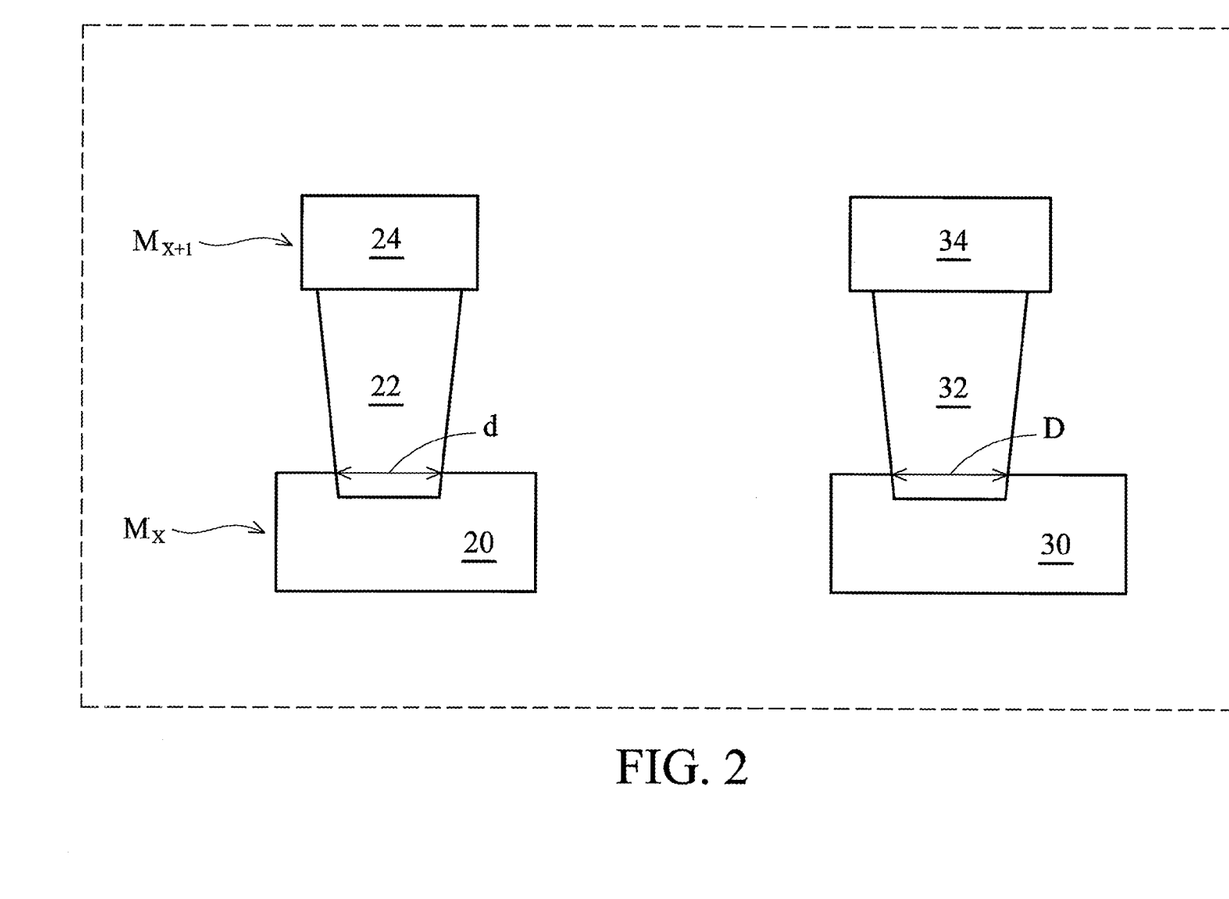
FIG. 2 illustrates portions of the cross-sectional view of the preferred embodiment.

FIG. 2 illustrates a portion of the cross-sectional view of the embodiment shown in FIG. 1 along line 2-2. It illustrates two metallization layers, $M_x$ and $M_{x+1}$, and connecting vias 22 and 32. As is known in the art, for process reasons, vias 22 and 32 are typically tapered from top to bottom. In the preferred embodiment of the present invention, the width d of via 22 is defined as the width along a top surface of metal line 20. The width D of via 32 is defined as the width along a top surface of metal line 30. Alternatively, width d and D may be defined as the widths of vias 22 and 32 along bottom surfaces of metal lines 24 and 34, respectively. The definition of the widths of vias, however, needs to be consistent from via to via.

Referring back to FIG. 1, pitch P is most likely greater than or equal to pitch p. If P is less than 1.1 p, width D of via 32 preferably equals width d of via 22. If pitch P is between about 1.1 p and about 3.5 p, which means that vias 32 and 38 have a greater distance than the distance between vias 22 and 28, the size of via 32 is preferably increased. Preferably, width D of via 32 is increased to a value greater than width d but less than about 1.4 d. More preferably, width D is between about 1.1 d and about 1.3 d. With a pitch P greater than pitch p, the increase in via width D is less likely to incur side effects, for example, bird's beak for vias 32 and 38. The increase in the via width D will result in the cross-sectional area of via 32 being desirably increased, and the current density flowing through via 32 will be decreased proportionally. Meanwhile, the width D' of via 38 is also preferably increased in a same scale as the width D of via 32, preferably greater than 1.0 d and less than about 1.4 d, and more preferably between about 1.1 d and about 1.3 d. Since vias 32 and 38 are symmetrical features, any subsequent discussion related to via 32 and its connecting features equally applies to via 38 and its connecting features.

If pitch P is greater than about 3.5P, which means that via 32 has an even greater distance from the neighboring vias, width D of via 32 is preferably increased to between about 1.1 d and about 1.4 d, and more preferably to between about 1.1 d and about 1.3 d.

While the via widths are increased, the widths of respective metal lines are preferably increased correspondingly. If via 32 has a width D greater than width d, the metal line width M is preferably increased to equal to or greater than (D/d)*m. The resulting metal line 30 will be less likely to be affected by the Joule effect. The width of the overlying metal line 34 is also preferably increased to equal to or greater than (D/d)*m.

Figure 3:
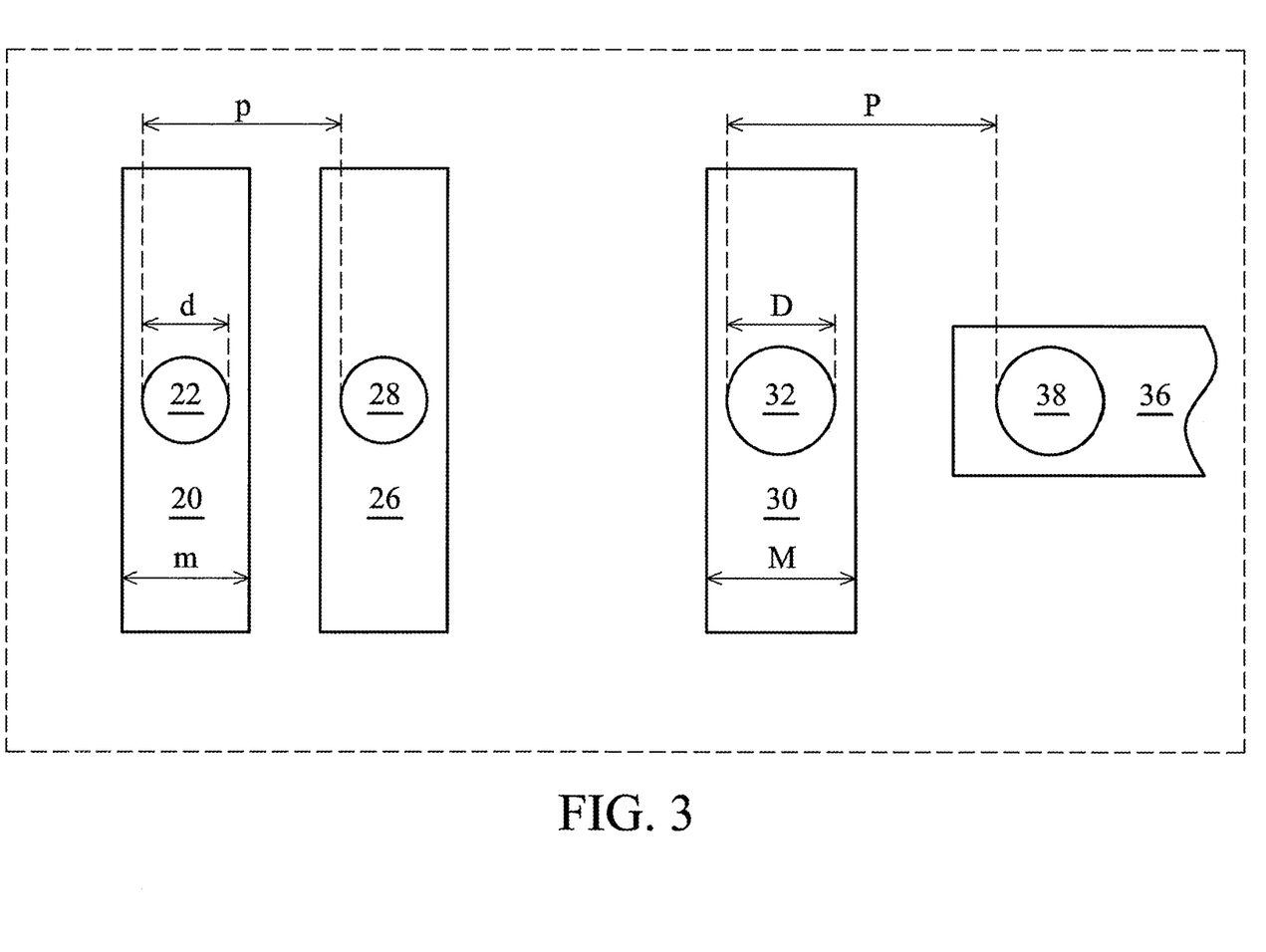
FIG. 3 illustrates a top view of a preferred embodiment having two groups of metal lines and vias, wherein at least one group has metal lines perpendicular to each other.

In FIG. 1, the pitches p and P are between vias on two parallel metal lines. FIG. 3 illustrates another example, wherein the metal lines are perpendicular to each other. In another embodiment (not shown), metal lines 20 and 26 are also perpendicular to each other. In yet another embodiments, one or more metal lines in FIG. 1 and FIG. 3 may further comprise L-shape portions or portions having other shapes (not shown).

Figure 4:
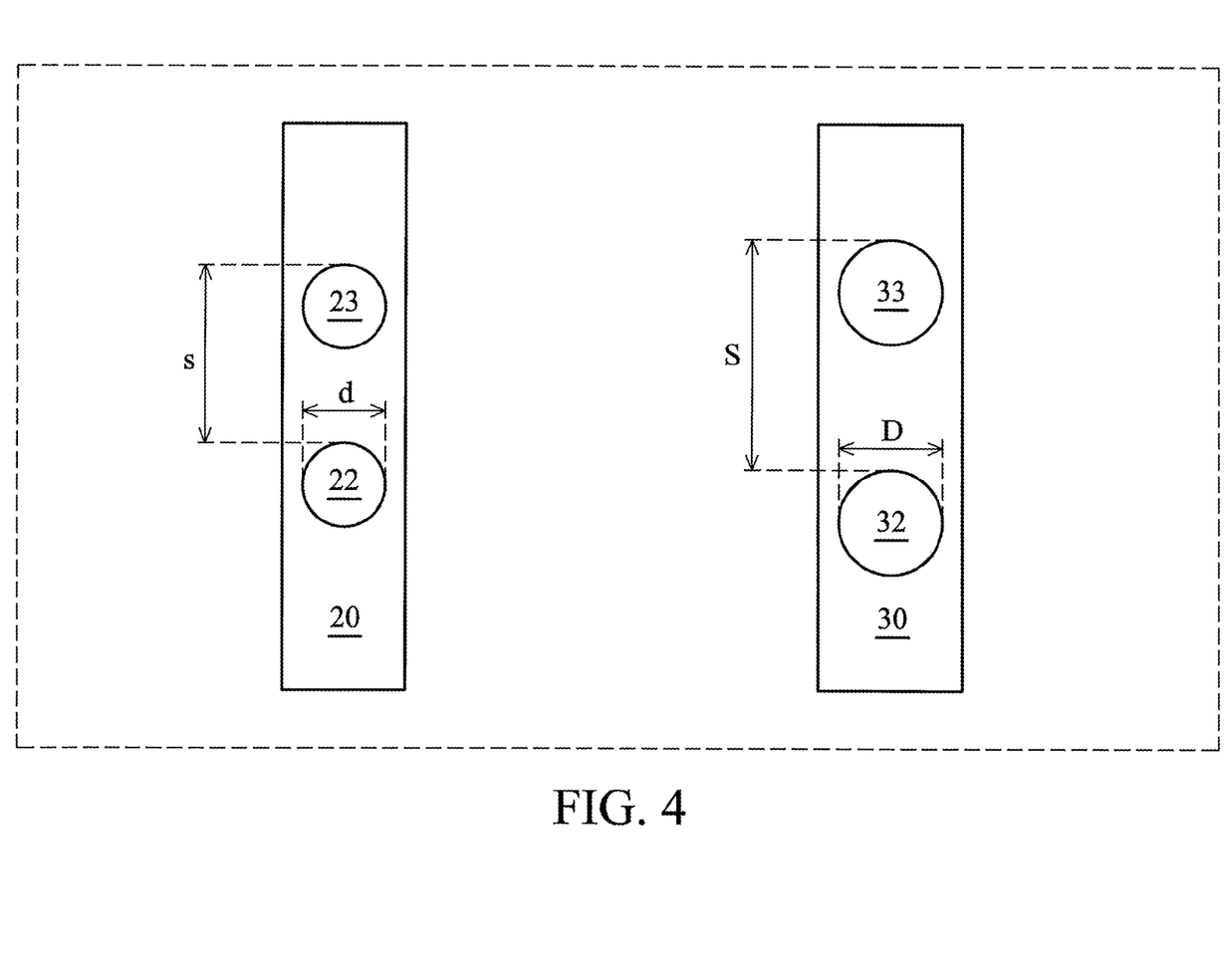
FIG. 4 illustrates a top view of a preferred embodiment, wherein pitches of vias are between vias on same metal lines.

FIG. 4 illustrates another embodiment of the present invention, wherein vias 22 and 23 are formed on a same metal line 20 and next to each other. Vias 22 and 23 have a pitch s, which is the minimum pitch of all vias on metal lines in the same layer. Via 22 has width d. Vias 32 and 33 are on a same metal line 30 and in a same metallization layer as vias 22 and 23. Via 32 has a width D, which is equal to or greater than width d of via 22. The pitch between vias 32 and 33 is S. In the preferred embodiment, if pitch S is greater than or equal to 1.1 s, then width D of via 32 is preferably increased to a value greater than width d of via 22 but less than or equal to 1.4 d. More preferably, width D is between about 1.1 d and about 1.3 d. If S is less than 1.1 s, however, width D is preferably equal to width d.

It should be realized that besides the pitch requirement discussed in the preceding paragraphs, the determination of whether to increase the via size of a via and/or a metal line width is also preferably based on design requirements, such as the maximum current density in the via and/or the metal line. In addition, other factors that will be discussed in subsequent paragraphs, such as the k value of the low-k dielectric material and metal line length, are preferably taken into account. Accordingly, vias in a same layer will have different widths. Also, even if the pitch P of a via is greater than 1.1 p, the width D of the via may still be set to d when other factors are taken into account. Some of the exemplary affecting factors are discussed as follows.

As is known in the art, low-k dielectric materials have low thermal conductivities. Therefore, vias and metal lines preferably have greater widths so that the Joule effect is minimal when low-k dielectric materials are used. In the preferred embodiment, if the k value of the low-k dielectric material in which the vias and metal lines are located is less than about 2.5, the via width and/or metal line width is preferably increased.

Experiments have indicated that the length of metal lines has effects on the reliability of vias connected to the metal lines. For example, a via connected to a 5 μm length metal line may be able to sustain five times the current density than a same via connected to a 250 μm length metal line without causing electro-migration failure. In the case where a long metal line is electrically connected to, for example, a metal interconnection in a logic device region, the width of the via is preferably increased. In the preferred embodiment (refer to FIG. 1), if at least one of metal line 30 and metal line 34 (refer to FIG. 2) has a length L satisfying $L/d^2>1000$, wherein L and d have the unit of microns, width D of via 32 is preferably increased. Conversely, if both metal lines 30 and 34 have lengths L satisfying $L/d^2<1000$, for example, when electrically connected to metal interconnection in a memory region, width D is not necessarily increased even when pitch P is greater than 1.1 p.

Figure 5:
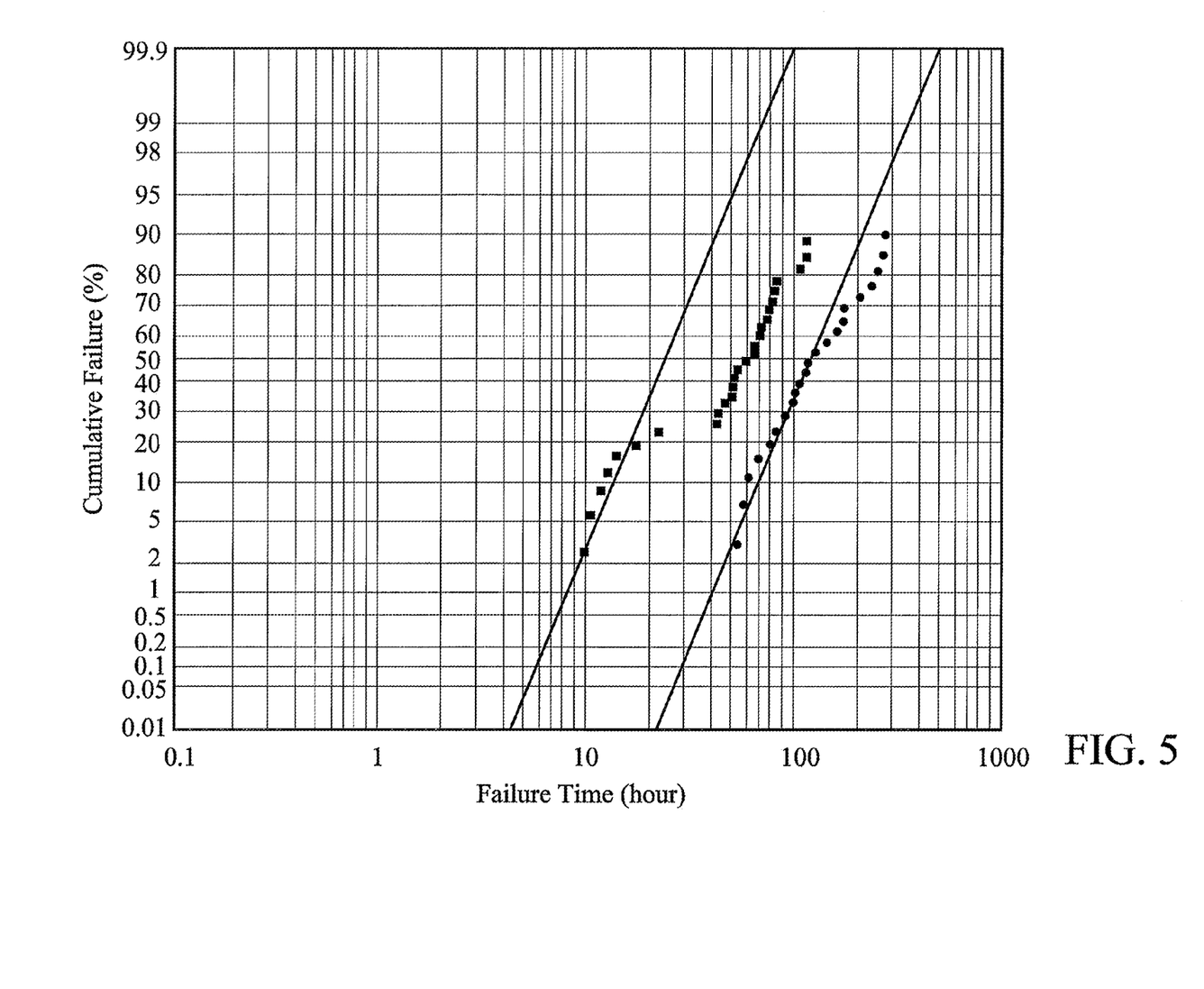
FIG. 5 illustrates the effects of lengths of metal lines to the reliability of connecting vias, wherein cumulative failures are shown as a function of failure time.

FIG. 5 illustrates the effects of lengths of metal lines to the reliability of vias, wherein cumulative failure is shown as a function of failure time. Solid squares represent data obtained from a metal line having a length of 250 μm, while solid circles represent data obtained from a metal line having a length of 5 μm. It is clear that a via connected to longer metal line has a shorter failure time than a via connected to a shorter metal line.

Figure 6:
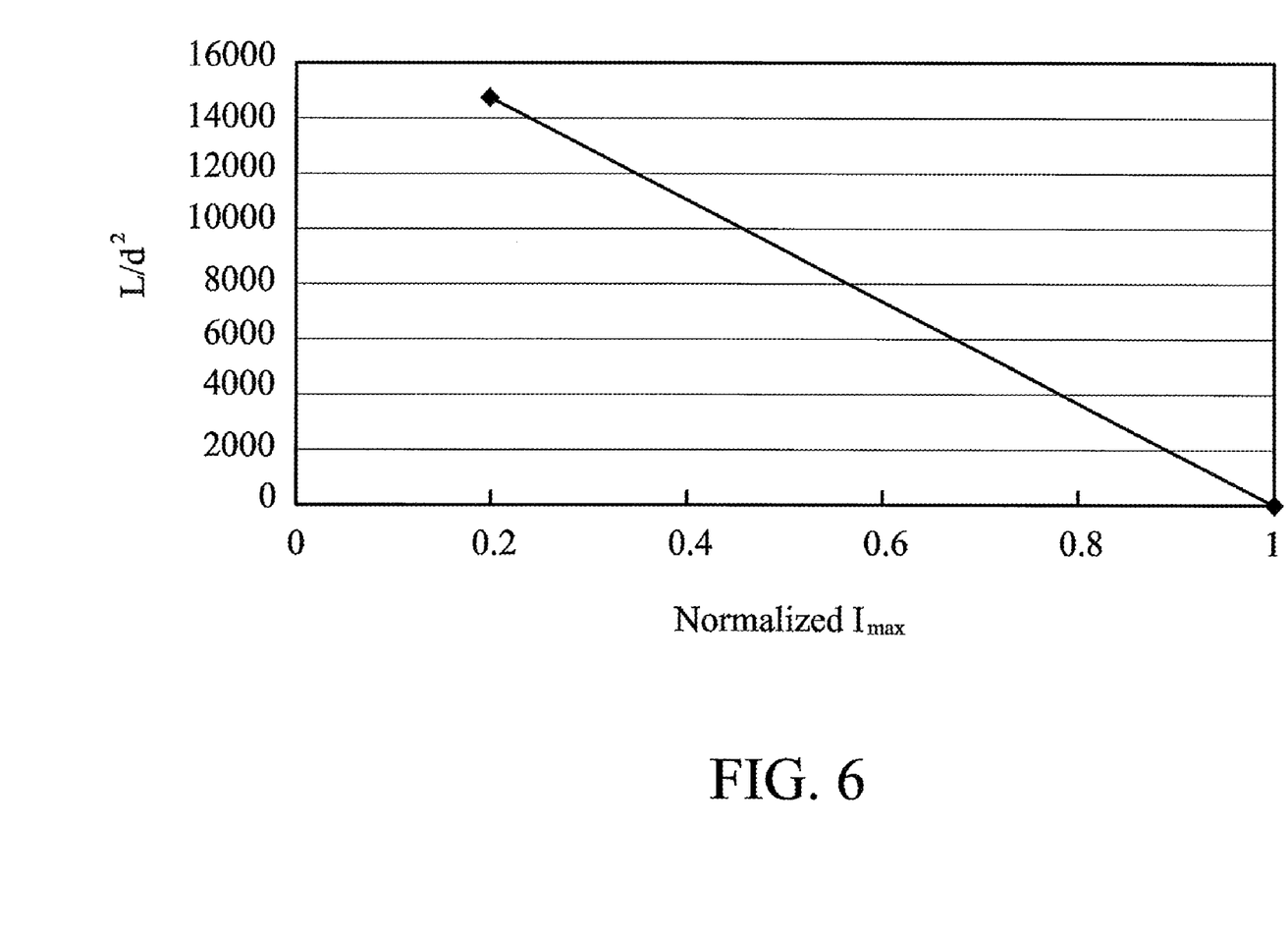
FIG. 6 illustrates the effect of width of vias and length of connecting metal lines to the maximum allowable current in the vias.

FIG. 6 illustrates the relationship between the maximum currents allowed in vias and width d of the vias as well as length L of the connecting metal lines. The Y-axis represents the values of $L/d^2$. The X-axis represents a normalized maximum allowable current ($I_{max}$), which is calculated as $I_{max}/I_{max0}$, wherein $I_{max0}$ is the maximum allowable current of a via connected to a 5 μm long metal line. Apparently, when a via is connected to a metal line having a length L of 5 μm, the normalized $I_{max}$ is 1. When the length L increases, $L/d^2$ increases, and the normalized $I_{max}$ decreases. To maintain normalized $I_{max}$ of vias to be greater than about 0.9, $L/d^2$ needs to be less than about 2000, and more preferably less than about 1000 if a higher safe margin is preferred.

In addition, the sizes of vias connected to wide metal lines have more room to be increased, therefore, if width M of metal line 30 is greater than about 5 d, width D of via 32 is preferably increased. An advantageous feature of the increase in width D is that the strength of the interconnect structure is more uniform with no significant weak point prone to failure, since vias connected to wide metal lines are typically weak points of the interconnect structures.

An example is given below to describe the determination of whether to increase width D. In an exemplary metallization layer, referring back to FIG. 1, width d of via 22 is about 30 nm, pitch p between vias 22 and 28 is about 70 nm, and width m of metal line 20 is about 36 nm. If pitch p between vias 32 and 38 is about 1.2 p, or about 84 nm, the decision of whether to increase width D of via 32 may be determined by the length L of metal line 30. If $L/d^2$ is greater than about 1000, width D may be increased to, for example, 1.3 d, or about 39 nm, and width M of metal line 30 may be increased to about (D/d)*m, or about 47 nm. If, however, $L/d^2$ is less than about 1000, width D may be equal to d, or about 30 nm, and width M of metal line 30 preferably stays at 30 nm. However, as discussed in preceding paragraphs, depending on the other factors that may affect the preferred values of widths D and M, width D of via 32 and width M of metal line 30 and/or 34 may be set to any value between the specified upper limits and lower limits.

The concept of the present invention can be applied to the modification of the design and manufacture of existing integrated circuits, for example, an existing integrated circuit that has already been laid out. The via width and/or metal line width may be increased whenever deemed possible, while the distribution of vias and metal lines does not need to be changed. Some via widths and/or metal line widths, however, may not be able to be increased due to other design rule limitations. For a new design of an integrated circuit, however, the distribution of vias and/or metal lines can be optimized for the concept of the present invention to be applied.

Figure 7:
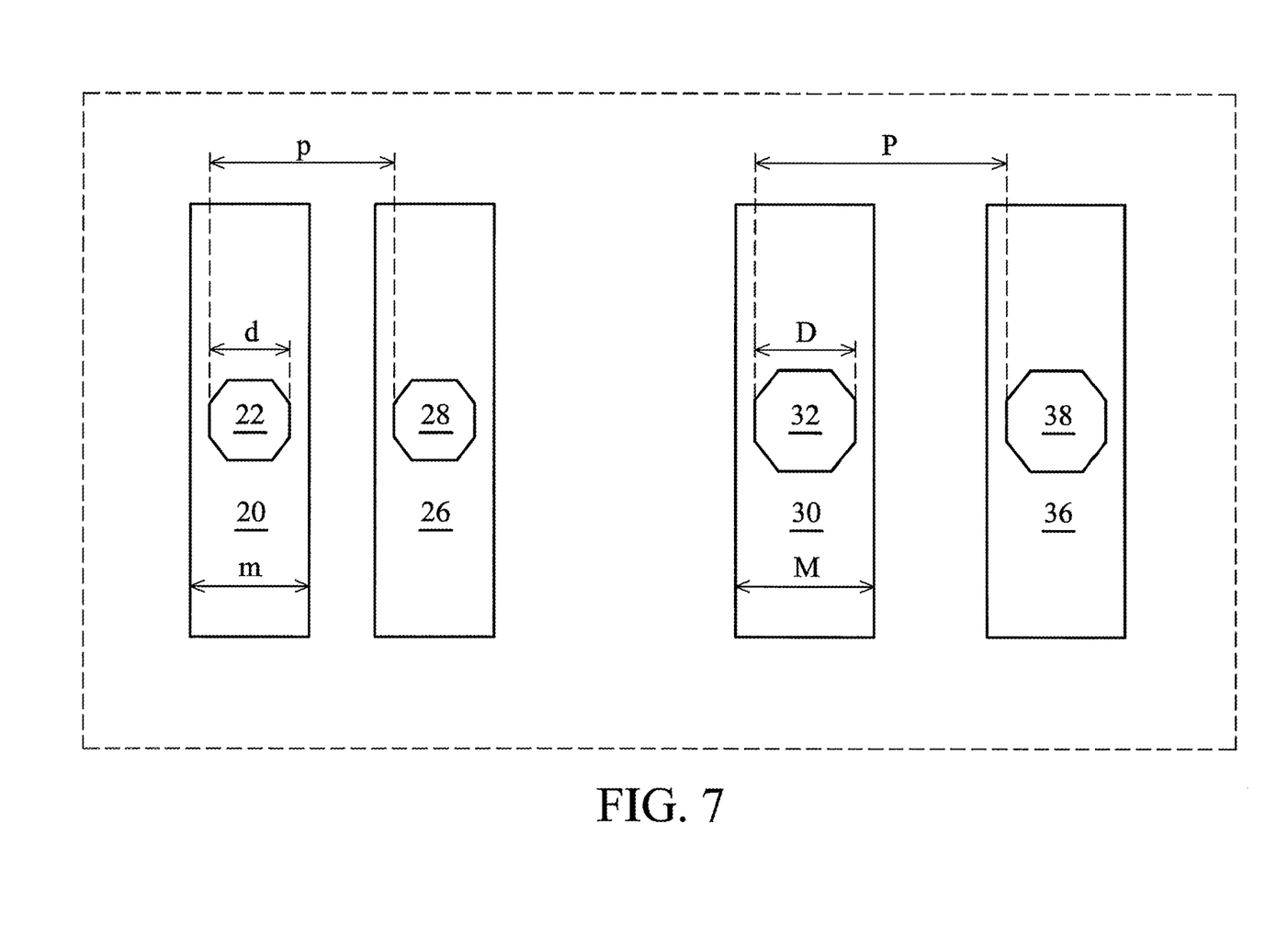
FIG. 7 illustrates vias having irregular shapes.

Vias are typically laid out as squares as compared to the circles as shown in FIG. 1. The circle-shaped vias are the results of optical effects. One skilled in the art will realize that any intermediate shape between a square and a circle can be formed in practical case. An example is shown in FIG. 7. The widths d and D of the vias having irregular shapes are preferably defined as the greatest width along a width direction of the respective metal lines.

The increase in via and/or metal line size is preferably achieved through layout change. Alternatively, the sizes of vias and/or metal lines may be increased through various optical proximity correction (OPC) means. In addition, changing the process conditions, such as the chemistry used in the interconnect structure formation process, can also cause the change of via and/or metal line widths.

Figure 8:
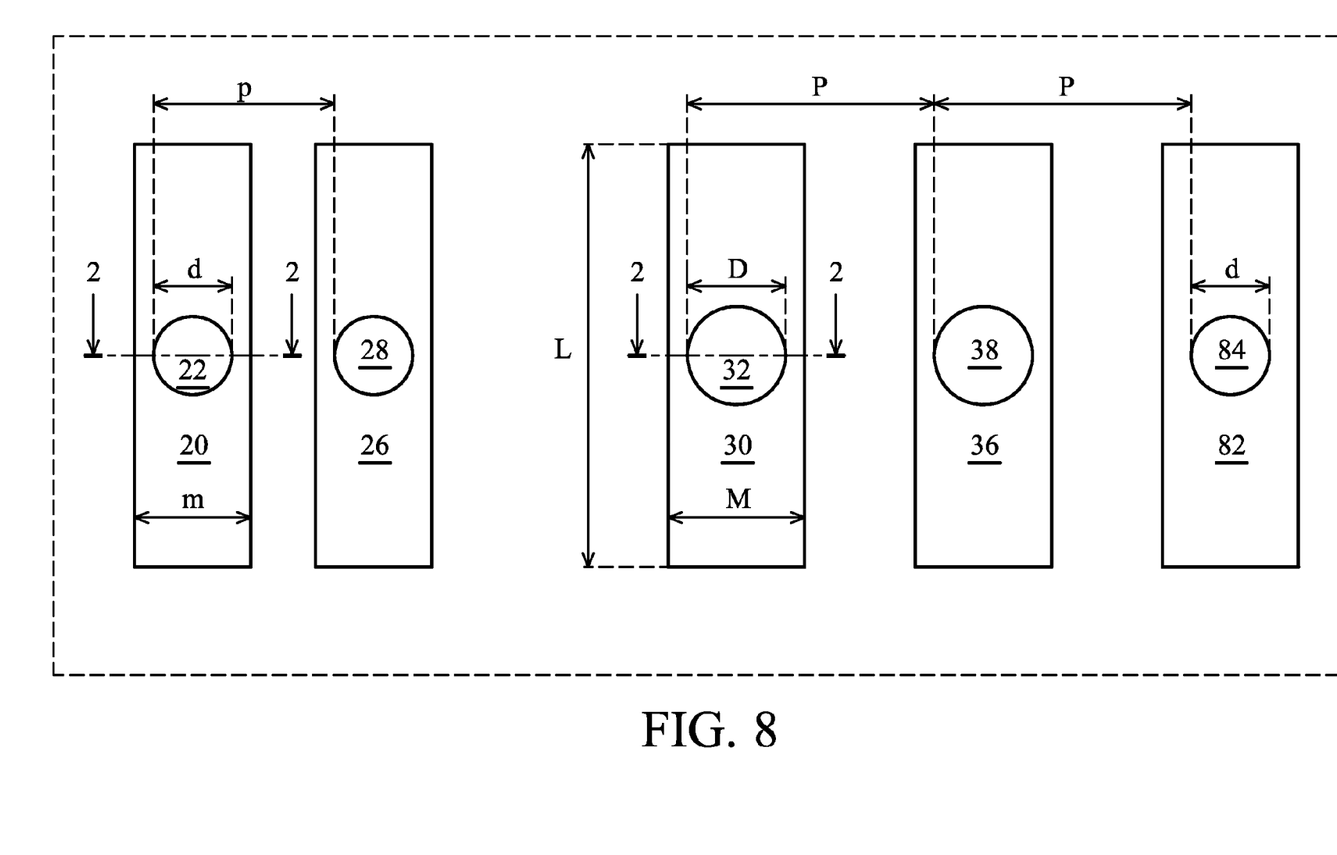
FIG. 8 illustrates a top view of metal lines and vias, wherein the vias have different sizes and the metal lines are parallel to each other.

FIG. 8 illustrates another embodiment of the present invention as discussed above, wherein like reference numerals refer to like elements. Shown in FIG. 8 is a metal line 82 in the same metallization layer as metal lines 20, 26, 30, and 36. The metal line 82 has a via 84 connected thereto. As shown in FIG. 8, the via 84 has a pitch P from the neighboring metal line 36, where pitch P is about 1.1 p, but the via 84 has a width d, substantially equal to the first width d of vias 22 and 28. In this embodiment, the metal line 82 may be connected, for example, to a metal interconnection in a memory device region.

By using the preferred embodiments of the present invention, the reliability of the integrated circuits is improved without additional cost. A further advantageous feature of the preferred embodiment of the present invention is that the reliability of an existing integrated circuit can also be improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   a metallization layer;
   a first metal line in the metallization layer;
   a first via electrically connected to the first metal line, wherein the first via has a first via width, and a first pitch from a nearest via on a neighboring metal line, and wherein the first pitch is a minimum pitch of all vias on the metallization layer;
   a second metal line in the metallization layer; and
   a second via electrically connected to the second metal line, wherein the second via has a second pitch greater than about 1.1 times the first pitch, and wherein the second via has a second via width greater than the first via width but no more than about 1.4 times the first via width.

2. The integrated circuit of claim 1, wherein the second pitch is greater than about 3.5 times the first pitch, and wherein the second via width is greater than about 1.1 times the first via width but no more than about 1.4 times the first via width.

3. The integrated circuit of claim 1, wherein the second via width is greater than about 1.1 times the first via width but no more than about 1.3 times the first via width.

4. The integrated circuit of claim 1 further comprising:
   a third metal line in the metallization layer; and
   a third via electrically connected to the third metal line, wherein the third via has a third pitch from a nearest via on a neighboring metal line, and wherein the third pitch is greater than about 1.1 times the first pitch, and wherein the third via has a third via width substantially equal to the first via width.

5. The integrated circuit of claim 4, wherein the third metal line is electrically connected to a metal interconnection in a logic device region.

6. The integrated circuit of claim 1, wherein the second metal line is electrically connected to a metal interconnection of a logic device region.

7. The integrated circuit of claim 1 further comprising an additional metal line connected to the second metal line by the second via, wherein at least one of the second metal line and the additional metal line has a length L, and wherein the length L and the first via width are in microns, and wherein L divided by a square of the first via width is greater than about 1000.

8. The integrated circuit of claim 1, wherein the first metal line has a first line width and the second metal line has a second line width, and wherein a ratio of the second line width to the first line width is greater than a ratio of the second via width to the first via width.

9. The integrated circuit of claim 1, wherein the first metal line has a first line width and the second metal line has a second line width, and wherein a ratio of the second line width to the first line width is greater than about five.

10. An integrated circuit comprising:
a metallization layer;
a first metal line having a first line width in the metallization layer;
a first via electrically connected to the first metal line, wherein the first via has a first via width and a first pitch from a nearest via on a neighboring metal line, and wherein the first pitch is a minimum pitch of vias on the metallization layer;
a second metal line in the metallization layer, wherein the second metal line has a second line width and a length, and wherein the length of the second metal line divided by a square of the first via width is greater than about 1000 when the length and the first via width are in microns; and
a second via electrically connected to the second metal line, wherein the second via has a second pitch from a via on a neighboring metal line, and wherein the second pitch is greater than about 3.5 times the first pitch, and wherein the second via has a second via width greater than the first via width but no more than about 1.4 times the first via width.

11. The integrated circuit of claim 10, wherein the second via width is greater than about 1.1 times the first via width but no more than about 1.3 times the first via width.

12. The integrated circuit of claim 10 further comprising:
a third metal line in the metallization layer; and
a third via on the third metal line, wherein the third via has a third pitch greater than about 1.1 times the first pitch, and wherein the third via has a third via width substantially equal to the first via width.

13. The integrated circuit of claim 10, wherein a ratio of the second line width to the first line width is greater than a ratio of the second via width to the first via width.

14. The integrated circuit of claim 10, wherein a ratio of the second line width to the first line width is greater than about 5.

15. An integrated circuit comprising:
a metallization layer;
a first metal line in the metallization layer;
a first via electrically connected to the first metal line, wherein the first via has a first via width, and a first pitch from a nearest via on the first metal line, and wherein the first pitch is a minimum pitch of all vias on the metallization layer;
a second metal line in the metallization layer; and
a second via electrically connected to the second metal line, wherein the second via has a second pitch from a nearest neighboring via on the second metal line, and wherein the second pitch is greater than about 1.1 times the first pitch, and wherein the second via has a second via width greater than the first via width but no more than about 1.4 times the first via width.

16. The integrated circuit of claim 15, wherein the second via width is greater than about 1.1 times the first via width but no more than about 1.3 times the first via width.

17. The integrated circuit of claim 10 further comprising:
a third metal line in the metallization layer; and
a third via electrically connected to the third metal line, wherein the third via has a third pitch from a nearest neighboring via on the third metal line, wherein the third pitch is greater than about 1.1 times the first pitch, and wherein the third via has a third via width substantially equal to the first via width.

18. The integrated circuit of claim 10, wherein the metallization layer is in a dielectric layer having a k value of less than about 2.5.

19. The integrated circuit of claim 10, wherein the first metal line has a first line width and the second metal line has a second line width, and wherein a ratio of the second line width to the first line width is greater than a ratio of the second via width to the first via width.

20. The integrated circuit of claim 10, wherein the first metal line has a first line width and the second metal line has a second line width, and wherein a ratio of the second line width to the first line width is greater than about 5.

* * * * *